United States Patent [19]

Clinton

[11] 4,362,987

[45] Dec. 7, 1982

[54] APPARATUS FOR DETECTING ELECTRICAL SHORTS IN ELECTRONIC CIRCUITS

[75] Inventor: James R. Clinton, Seattle, Wash.

[73] Assignee: Huntron Instruments, Inc., Lynnwood, Wash.

[21] Appl. No.: 186,493

[22] Filed: Sep. 12, 1980

[51] Int. Cl.³ ............................................. G01R 31/08
[52] U.S. Cl. .................................. 324/52; 324/73 PC
[58] Field of Search .......... 324/52, 62, 73 PC, 158 T, 324/158 P

[56] References Cited

U.S. PATENT DOCUMENTS

| | | | |
|---|---|---|---|
| 3,973,198 | 8/1976 | Hunt | 324/158 T X |
| 3,992,663 | 11/1976 | Seddick | 324/52 |
| 4,220,913 | 9/1980 | Howell et al. | 324/52 |
| 4,230,982 | 10/1980 | DeMesmaeker | 324/52 |
| 4,313,169 | 1/1982 | Takagi et al. | 324/52 X |

*Primary Examiner*—Stanley T. Krawczewicz

*Attorney, Agent, or Firm*—Cole, Jensen & Puntigam

[57] ABSTRACT

A signal source in the form of a 60 Hertz voltage generator provides a 12 volt peak-to-peak signal to the primary winding of a transformer having a secondary winding which has an upper lead, a lower lead, a return lead which is between the upper and lower leads, and a tap lead between the lower lead and the return lead. The lower lead is connected through a variable resistance to the return lead. The movable arm of the variable resistance is connected to a first amplifier circuit, the output of which is applied to one of the horizontal deflection plates of an oscilloscope. The upper lead is connected through a 5 ohm resistor to ground and also to the input of a second amplifier circuit, the output of which is applied to one of the vertical deflection plates of the oscilloscope. The tap lead is connected to a first test lead, and the other test lead is connected to ground. The two test leads are moved by an operator along the circuit being tested to locate electrical shorts in the circuit and/or the elements comprising the circuit.

11 Claims, 12 Drawing Figures

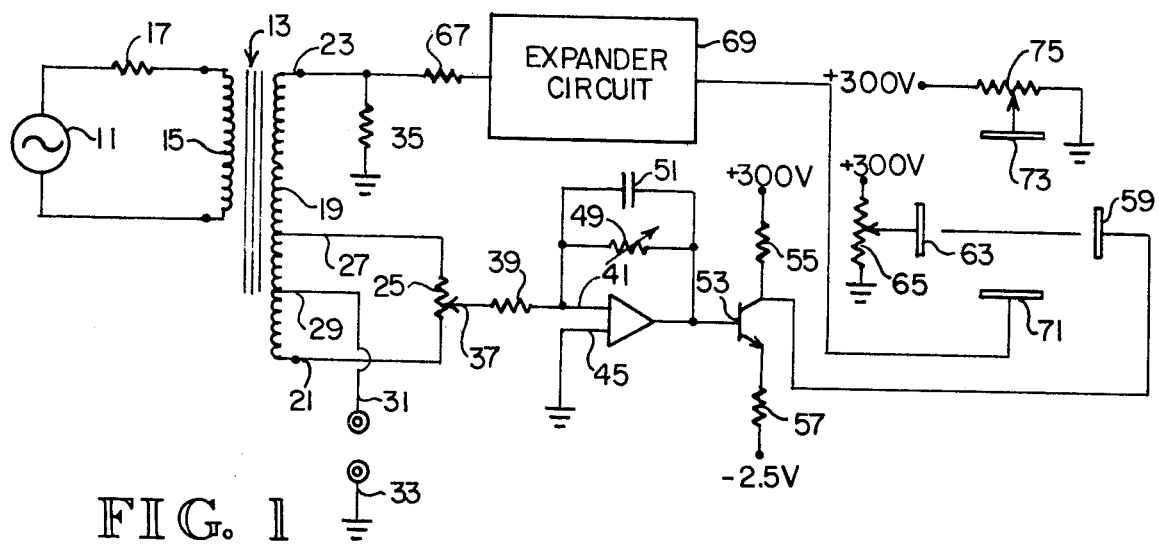
FIG. 1
FIG. 2
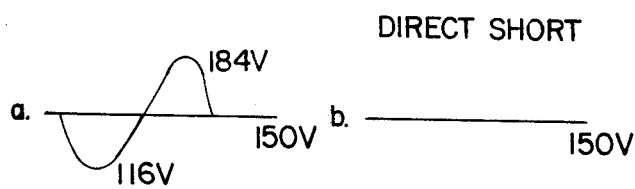
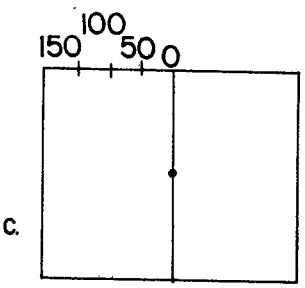
FIG. 3
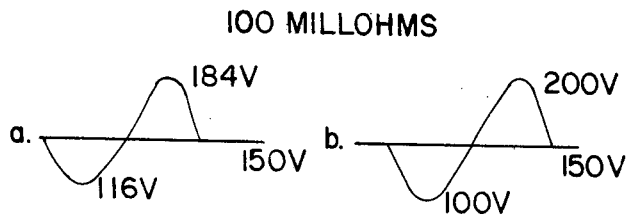
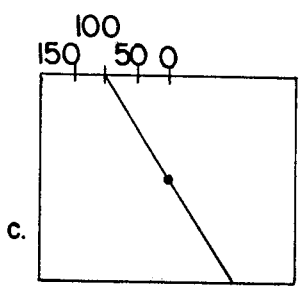
FIG. 4
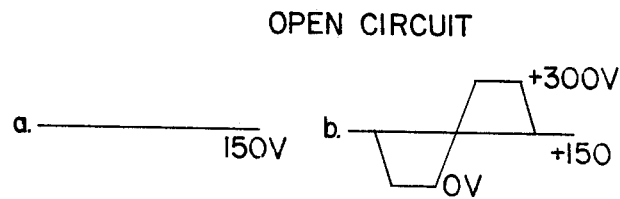
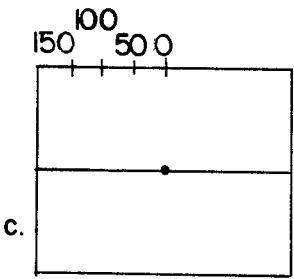

4,362,987

APPARATUS FOR DETECTING ELECTRICAL SHORTS IN ELECTRONIC CIRCUITS

BACKGROUND OF THE INVENTION

This invention relates generally to electronic test instruments for use primarily with printed circuits, and more specifically concerns a test instrument which is adapted particularly to detect electrical shorts in printed circuits, specifically electrical shorts between two or more etchings of the printed circuit board, but is also capable of detecting electrical shorts in circuit elements whether or not in a printed circuit environment.

Printed circuits are, of course, in common use throughout the electronic industry. Generally, printed circuits comprise an electrically insulating board element, a plurality of electronic circuit elements such as resistors, capacitors, inductors, and semiconductive active devices mounted on the board element, and a plurality of electrically conductive printed circuit board etchings, which are designed in a particular pattern so as to connect the circuit elements to form a particular circuit design.

In the manufacture of such circuits, the etchings are typically formed on the printed circuit board by a machine process and the electronic elements are typically soldered, either by machine or hand, into place in openings provided therefor in the printed circuit board. In such manufacture of printed circuits, however, there may occur solder bridges across one or more of the etchings. An example of this is shown in FIG. 6. Also, one or more of the circuit elements themselves may be shorted when installed or become shorted during installation, or in later use. These electrical shorts will, of course, be detrimental to the operation of the electronic circuit and are hence undesirable. However, such electrical shorts have proven to be difficult and/or timeconsuming to locate in circuit with conventional test means. In some cases, expensive circuit boards must be discarded because it is not economical to attempt to locate the shorts.

Accordingly, it is a general object of the present invention to provide an apparatus which is capable of detecting electrical shorts in electronic circuits, particularly printed circuits, which overcomes one or more of the disadvantages of the prior art noted above.

It is an additional object of the present invention to provide such an apparatus which uses only two test leads.

It is a further object of the present invention to provide such an apparatus which provides the information concerning the location of electrical shorts visually.

It is another object of the present invention to provide such an apparatus in which the visual information concerning the location of the shorts is easy to interpret, even by an operator unsophisticated in the operation of the apparatus.

It is yet another object of the present invention to provide such an apparatus which provides a fast visual response as the test leads are moved on the printed circuit.

It is a still further object of the present invention to provide such an apparatus in which the visual information changes appreciably as the test leads approach the location of the electrical short.

SUMMARY OF THE INVENTION

Accordingly, the present invention is an apparatus for detecting electrical shorts. The apparatus is particularly useful with printed circuits but its utility is not limited thereto. The apparatus includes an impedance means which has first and second leads extending therefrom; first and second test leads, with one test lead being connected to the first lead from the impedance means and the other test lead being connected to ground; and a resistor which is connected between the second lead from the impedance means and ground. Means are included for inducing an AC signal into the impedance means, which results in an AC signal, referred to as a test signal, appearing on the first lead. When there is some resistance between the test leads, i.e. when the test leads are placed on a printed circuit, for instance, the test signal will cause a current flow in the circuit which comprises the first impedance means, the first and second test leads, the impedance between the test leads, whatever that may be, the resistance means, and ground. Also included are a visual indicator means, such as an oscilloscope, and first and second amplifiers. The visual indicator means has vertical and horizontal deflection plates. The first amplifier includes means which is connected to the impedance means for applying the approximate value of voltage on the first transformer lead to the input of the first amplifier and means applying the output of the first amplifier means to one of the horizontal deflection plates of the visual indicator means. The second amplifier means includes means connecting the second lead to the input of the second amplifier means and means connecting the output of said second amplifier to one of the vertical deflection plates of the visual indicator means. The second amplifier includes means for maintaining the peak voltage of the signal applied to the vertical deflection plates at a predetermined level, regardless of the peak voltage of the input signal to the second amplifier means.

DESCRIPTION OF THE DRAWINGS

A more thorough understanding of the invention may be obtained by a study of the following detailed description taken in connection with the accompanying drawings in which:

FIG. 1 is a block diagram of a preferred embodiment of the present invention.

FIGS. 2a, 2b and 2c are waveforms present at particular points in the circuit of FIG. 1 when a direct short is presented between the test leads.

FIGS. 3a, 3b and 3c are waveforms at the circuit points of FIG. 2 when a resistance of 100 milliohms is presented between the test leads.

FIGS. 4a, 4b and 4c are waveforms at the circuit points of FIG. 2 when there is an open circuit between the test leads.

DESCRIPTION OF THE PREFERRED EMBODIMENT

Figure 5:
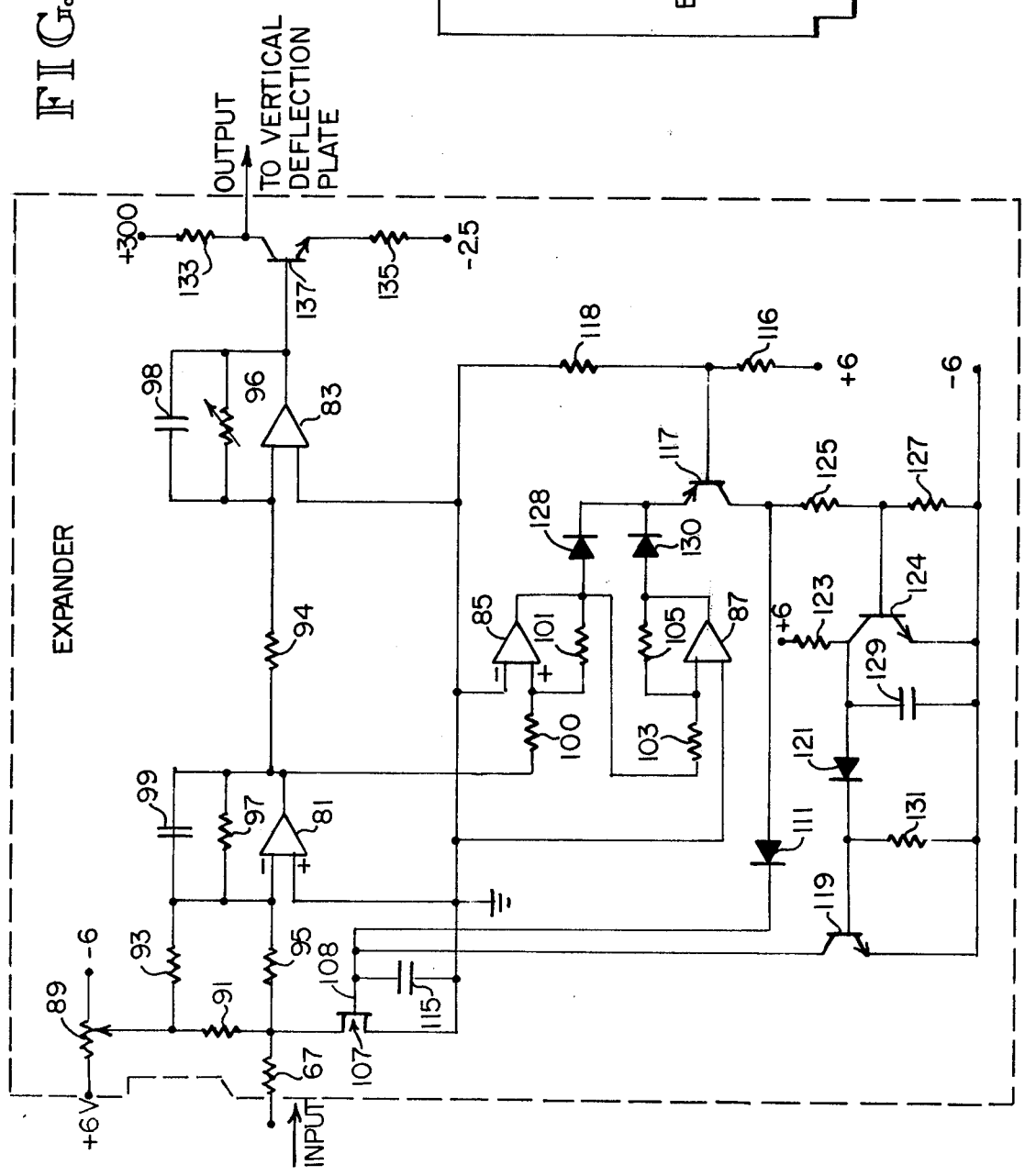
FIG. 5 is a schematic diagram of the expander circuit portion of the block diagram of FIG. 1.

The present invention is shown in block diagram form in FIG. 1. A voltage generator 11 produces a signal with a frequency of 60 Hertz and a peak-to-peak voltage of 12 volts in the embodiment shown. The voltage generator 11 has an internal impedance of less than 1 ohm, and delivers up to 400 milliamperes of current at its voltage rating. A voltage generator with such specifications is commercially available from several manufacturers. It should be understood, however, that the specifications for the voltage generator are somewhat arbitrary, and may vary from embodiment to embodiment.

The signal produced by voltage generator 11 is applied to a transformer 13. The transformer 13 has a primary winding 15 with 140 turns. A limiting resistor 17 of 6.8 ohms insures that the maximum flux created in the transmformer 13 is restricted to a level which is approximately 50% of the saturation point for the particular core material and core size of transformer 13. This results in a linear transformation of the signal in primary winding 15 to the secondary winding 19. The secondary winding 19, which in the embodiment shown has 180 turns, has a bottom lead 21 and a top lead 23 which are connected, respectively, to the lower and upper ends of secondary winding 19.

The bottom lead 21 is connected through a variable resistance 25 to a return tap lead 27 which is in turn connected to secondary winding 19 at the point where there are 100 turns between top lead 23 and return tap lead 27, and 80 turns between return tap lead 27 and bottom lead 21. An intermediate tap lead 29 is connected to secondary winding 19 at a centerpoint between return tap lead 27 and bottom lead 21, so that there are 40 turns between return tap lead 29 and intermediate tap lead 29, and 40 turns between intermediate tap lead 29 and bottom lead 21. Hence, without a load on the transformer, the voltage between top lead 23 and intermediate top lead 29 will be 12 volts peak-to-peak, while the voltage between return tap lead 27 and bottom lead 29 will be 3.4 volts peak-to-peak. Thus, the subwindings between intermediate tap lead 29 and return tap lead 27 and between intermediate tap lead 29 and bottom lead 21 are balanced about intermediate top lead 29.

Intermediate tap lead 29 is connected to a first test lead 31 while a second test lead 33 is connected to ground. Test leads 31 and 33 may be conventional test leads used commonly with electronic instruments, and in operation may be conveniently moved by the operator along printed circuit etchings, or in other circuits, to determine the location of electrical shorts. When a signal is induced into secondary winding 19, what is referred to as a test signal is developed on intermediate tap lead 29. The test signal is an alternating current sine wave having a frequency of 60 Hertz. This signal is applied to the electronic circuit being tested through test leads 31 and 33, resulting in a current flow through the closest shorted circuit element or shorted etching, if any, and a voltage drop across the terminals of the test leads. The operation of the circuit in FIG. 1 is described in more detail hereinafter. The top lead 23 is connected through a low resistance 35 to ground, which in the embodiment shown is 5 ohms, so that when there is a resistance of some value between test leads 31 and 33, current flows in the circuit comprising low resistance 35, the portion of secondary winding between top lead 23 and intermediate tap lead 29, test leads 31 and 33, the resistance between the test leads, and ground.

The center arm 37 of variable resistance 25 is connected to an input resistance 39 to the inverting input 41 of an operational amplifier 43. The noninverting input 45 of operational amplifier 43 is connected to ground. In the embodiment shown, the value of input resistance 39 is 50 Kohms, and serves to isolate operational amplifier 43 from the secondary winding of the transformer 13. Operational amplifier 43 is referenced to ground through resistance 39, variable resistance 25 and low resistance 35.

Connected between the output connection 47 of operational amplifier 43 and the inverting input 41 thereof is a parallel connection of a variable resistor 49, which in the embodiment shown is 1.5 megohms, and a capacitor 51, which in the embodiment shown is 0.002 microfarads. The DC output of operational amplifier 43 is zero, and the gain of the amplifier may be adjusted between 0 and 30 by adjusting the value of variable resistance 49.

The output connection 47 of operational amplifier 43 is connected to the base of a transistor 53. The collector of transistor 53 is connected through a resistance 55 to a +300 volt supply, while the emitter is connected through a resistance 57 to −2.5 volts. The collector of transistor 53 is also connected to the right horizontal deflection plate 59 of a visual indicator device 61, such as an oscilloscope. The left horizontal deflection plate 63 is connected to the center arm of a variable resistance 65 which is connected between a +300 volt supply and ground.

The junction of top lead 23 of secondary winding 19 and low resistance 35 is connected to an input resistance 67, which in the embodiment shown is 50 Kohms, at the input of a vertical amplifier 69, referred to in the embodiment shown as an expander circuit. The input resistance 67 is for electrical isolation, similar to the function of resistor 39 for operational amplifier 43. The expander circuit 69, which is explained in more detail hereinafter, provides a fixed peak voltage output, 68 volts peak-to-peak in the embodiment shown, for any signal input into the expander having at least a threshold voltage level of 0.2 volts. The expander circuit 69 includes a variable gain circuit which insures that the highest peak, whether that is positive or negative, of the input signal is amplified to 68 volts, with the remainder of the input signal being amplified accordingly.

The output of expander circuit 69 is applied to the lower vertical deflection plate 71 of the visual indicator means 61. The upper vertical deflection plate 73 is connected to the center arm of a variable resistance 75, which is connected between a +300 volt supply and ground.

In operation, the voltage appearing at the input to operational amplifier 43 is amplified by the circuit comprising both amplifier 43 and transistor 53 and appears as a deflection voltage for the horizontal deflection circuit of the oscilloscope. Correspondingly, the voltage appearing at the input to expander circuit 69 is amplified and appears as a vertical deflection voltage for the vertical deflection circuit of the oscilloscope. The combination of the horizontal and vertical deflection voltages results in a straight line trace on the oscilloscope screen, running through the center of the screen. The angle of the trace will change as the resistance between test leads 31 and 33 changes. An increase in the test resistance will cause a counter-clockwise rotation of the trace while a decrease in the test resistance will cause a clockwise rotation of the trace.

It is important that the trace be exactly vertical when there is zero resistance between the test leads. The resistance in the test leads themselves is often sufficient, however, to cause a deflection in the trace, and must hence be compensated for. This resistance is nulled out by adjusting the center arm 37 of variable resistance 25. With the test leads shorted, the center arm is moved off center so that a small correction voltage is provided to the input to the horizontal amplifier to offset any voltage that might otherwise appear due to the resistance of the test leads. Consequently, a zero voltage signal is amplified through the horizontal amplifier circuit, and zero voltage will appear at the horizontal deflection circuit. Thus, there will be no horizontal deflection and the resulting trace will be a vertical line in the center of the screen.

In the embodiment shown, the horizontal deflection sensitivity of the oscilloscope used in the embodiment shown is 25 volts per centimeter. The gain of the combination of amplifier 43 and transistor 53 is set so that a resistance of 100 milliohms between test leads 31 and 33 results in a 2 centimeter deflection, i.e. a counter-clockwise rotation of the trace sufficient that the top and bottom of the trace are 2 centimeters from the vertical axis of the screen. Full horizontal deflection, i.e. 3 centimeters, occurs for a resistance of 150 milliohms in the embodiment shown. These values of course can be adjusted within the spirit of the invention. A 2 centimeter deflection requires 50 volts at the right hand deflection plate 59. Since in the embodiment shown a 100 milliohm test resistance results in a current of 225 milliamperes peak in secondary winding 19, a 45 millivolt peak-to-peak voltage signal appears on intermediate tap lead 29. The gain required to provide a 50 volt output is thus 2222. Thus the combined gain of amplifier 43 and transistor 53 is set at 2222 in the embodiment shown. Since transistor 53 has a voltage gain of 82, he gain of operational amplifier 43 is set, by adjusting resistor 41, to $2222/87 = 27$.

The DC level of the input to operational amplifier 43 is zero, as is the DC level of the output, so that the DC level of the signal at the base of transistor 53 is also zero. However, the output of transistor 53 has a 150 volt DC reference level. This is equal to the voltage on left deflection plate 63, which is adjusted by changing the position of the center arm of variable resistance 65. Thus, when there is no AC horizontal signal, the trace on the screen is horizontally centered. The 150 volt DC reference at the collector of transistor 53 is achieved as follows. Since the base of transistor 53 is at zero volts DC, the emitter will be at approximately −0.65 volts, resulting in an emitter current of 0.841 milliamperes. Since approximately this value of current flows in the collector circuit, the voltage drop across resistor 55 will be approximately 150 volts, providing the required DC collector voltage of 150 volts.

The schematic diagram of the expander circuit 69 which is shown in block diagram form in FIG. 1 is shown in FIG. 5. In particular, the detailed circuit arrangement for expander 69 is shown. The expander circuit referred to generally at 69 is basically an audio amplifier with automatic gain control circuitry. The output signal from the expander circuit, which is applied to the lower vertical deflection plate 71 of the oscilloscope, is inverted relative to the input signal. The input signal is referenced with respect to ground, and the output signal is referenced to a specified DC output level, 150 volts in the embodiment shown, that remains constant for a zero voltage input. For each test event, the highest peak value of the input signal, whether that peak be negative or positive, is recognized by the expander circuitry, and the gain of the expander than adjusted so that the highest peak of the input signal is amplified to the desired output signal level, with the remainder of the input signal being amplified accordingly.

The expander circuit shown operates on a cycle by cycle basis, i.e., the automatic gain feature completes its gain adjustment within one cycle after the test event is initiated. This fast response, while not necessary to the operation of the invention, is highly desirable, since it prevents any undesirable flutter movement in the initial display of the trace, which would be disturbing to a viewer. For a 60 Hz input signal, the automatic gain adjustment in the circuit shown is completed within 20 milliseconds. The inventors have discovered that the circuit shown has very good operating characteristics. The change in output voltage is less than 0.3 db over a dynamic input level change of 50 db, and the total harmonic distortion is less than 1% over the entire dynamic range.

In detail, the expander circuit 27 includes four operational amplifiers 81, 83, 85 and 87. Operational amplifier 81, in combination with resistors 89, 91, 93, 95, 97 and capacitor 99, form a low noise amplifier having a voltage gain of approximately 14 when the circuit is stabilized. The operational amplifier selected has a very low noise figure because of the inherent low input signal voltage level. Resistance 89, 5 Kohms, compensates for the offset input level of operational amplifier 81, while resistances 91, 1.2 M ohm, and 93, 1 M ohm, are used to balance the voltage across resistance 95, 3.3 Kohm. This offset compensation circuitry provides a small current to the input junction of resistors 95 and 67 to prevent leakage from field effect transistor 107, after being amplified, from initiating operation of the automatic gain circuit. It also overcomes the inherent offset of the op amp 81, and the offset of other circuit elements, so that it acts generally like a system DC balance control.

Op amp 83, and resistances 94, 1 Kohm, and 96, 215 Kohm, and capacitor 98, 0.001 microfarad, form the second main signal amplifier. Capacitor 98 is used to reduce the amplification of the high frequency noise. The gain of this stage is approximately 25, so that the output voltage can be adjusted from zero to a maximum 2.5 volts peak-to-peak. Op amp 85, with resistor 100, 10 Kohm, and resistor 101, 68 Kohm, form the positive-going automatic gain feedback amplifier. Op amp 87, in combination with resistor 103, 10 Kohm, and resistor 105, 10 Kohm, is an inverter for the signal from op amp 87. The gain of the feedback amplifier is 68 in the embodiment shown. The combined output of amplifiers 85 and 87, through diodes 128 and 130, will be always either positive or negative. The polarity of the output signal from this amplifier is determined by the polarity of the maximum peak of the input signal. The output of the amplifier controls the operation of transistor 117, which in turn controls the operation of the automatic gain circuit, as explained in more detail hereinafter.

The amplitude of the signal into operational amplifier 81 is controlled by field effect transistor 107. Input resistance 67, 50 Kohm, and the drain-source resistance of field-effect transistor 107 in effect form a voltage divider whose output voltage is dependent upon the DC voltage level at the gate of field-effect transistor 107. The bar resistance of the field-effect transistor 107 is linear only over a very small range of drain-to-source voltage so that the maximum peak-to-peak voltage on the drain connection of transistor 107 is held to less than 7 millivolts.

When there is no signal at the input to the expander circuit 69, the circuit is in a quiescent condition. When the expander is in its quiescent condition, field-effect transistor 107 must be biased so that it is completely off. This assures that op amp 81 can accept low level input signals, below its threshold level, without the automatic gain action of the expander circuit being initiated, which would further reduce those low level input signals.

For field-effect transistor 107 to be biased completely off, so that its drain-source bar resistance is maximum, a sufficient bias must be maintained on its gate. This occurs in the embodiment shown at $-6$ volts, due to capacitor 115 being fully charged from the $-6$ volt supply line through the collector-emitter circuit of transistor 119. The $-6$ volts on gate 108 of field-effect transistor 107 is sufficient to cause it to be fully turned off. Transistor 119 is biased into saturation because of the $+6$ volts on its base from the $+6$ volt supply through resistor 123 and diode 121. The drain-source bar resistance of transistor 107 when it is biased off is typically in excess of 1 megohm. Diode 111 is back biased and therefor not conducting from the supply through resistors 125 and 127. Diode 121 is a multi-junction diode and has a forward voltage drop of approximately 3.5 volts. This results in a voltage at the collector of transistor 124 of approximately $-1.85$ volts.

Since, in the expander's quiescent condition, the collector of transistor 117 is at $-6$ volts and the transistor is not conducting, there is no current through resistor 125 and transistor 124 is held in an "off" condition, because its base-emitter voltage will be held close to zero volts by resistor 127. The resistors 116 and 118, acting as a voltage divider from the 6 volt supply, establish a voltage of 2.7 volts at the base of transistor 117. During this time, capacitor 129 will have a charge on it of approximately 4.15 volts. This charge flows through resistor 123 until transistor 119 starts to conduct through diode 121, at which time the conventional clamping action of diode 121 prevents the charge from increasing. The final voltage at the collector of transistor 124 under quiescent conditions, as stated above, is approximately $-1.85$ volts.

An input signal applied to the expander circuit will cause the circuit to change from a quiescent condition to an active condition. At the initialization of active operation, over 90% of the current from the input signal flows through resistor 95 into the inverting input of op amp 81. When the output voltage of op amp 81 reaches approximately ±58 millivolts, and the output of one of the op amp combinations 85 and 87 goes above the bias voltage at the base of transistor 117, diode 128 or diode 130 begins to conduct, causing transistor 117 to turn on. This initiates operation of the gain control circuit. If the gain control circuit is not quickly effective, amplifier 81 will go quickly into saturation. The output of op amp 85 is positive when the input signal to op amp 81 is positive, and diode 128 conducts, while when the input signal to op amp 81 is negative, op amp 87 will have a positive output signal, and diode 130 will conduct.

The collector voltage of transistor 117, which is $-6$ volts during the quiescent condition of the expander circuit, will start to rise the instant that transistor 117 turns on, i.e. when the voltage on the emitter goes above the bias voltage on the base of the transistor. The collector voltage on transistor 117 will continue to rise with a rise in the output voltage from op amp 81, until the diode 111 starts conducting. As diode 111 begins to conduct, the charge on capacitor 115 will be reduced, through a circuit comprising diode 111, the collector-to-emitter resistance of transistor 117, diode 128 or 130, and the output resistance of amplifier 85 or 87. Consequently, the gate voltage of transistor 107 will rise and the drain-source bar resistance will decline.

At the same time, the collector current of transistor 117 flows through resistor 125 and the base-emitter circuit of transistor 124, which results in transistor 124 rapidly turning on, which in turn results in capacitor 129 discharging through the saturation resistance of transistor 124. As the voltage on the collector of transistor 124 is thus reduced, current flow through the base-emitter circuit of transistor 119 will cease, and it will be turned off by resistor 131. Consequently, the collector resistance of transistor 119 will increase, eliminating the charge path for capacitor 115.

Since the charge path for capacitor 115 is eliminated, and diode 111 is conducting, which results in a reduction of the charge on capacitor 115, the voltage on the gate of field-effect transistor 107 changes to the point where the drain-source bar resistance starts to limit the incoming signal current to resistor 95. A point of equilibrium is soon reached, before the input signal moves through one cycle. At this point of equilibrium, the drain-source bar resistance of transistor 107 stops changing, the input voltage to amplifier 81 stops changing, the output voltage from op amp 85 or 87 will stop changing, the emitter and collector current of transistor 117 will stop changing, the voltage drop across resistor 125 will stop changing, and the charge on capacitor 115 will stabilize. At this point, the operation of the circuit is stabilized to a particular gain which provides the desired peak voltage, at the output of op amp 81.

Between successive pulses, when the input signal is zero, capacitor 115 will maintain the correct bias voltage on the gate of transistor 107 to maintain a constant DC output from amplifier 83. Thus, the desired DC reference output is maintained. Also, the desired gain control action is maintained from cycle to cycle by the action of resistor 123 and capacitor 129. The voltage on the collector of transistor 124 will start to rise between successive pulses, due to the time constant of resistor 123 and capacitor 129. Since the time between successive pulses at the collector of transistor 117 is 16.7 milliseconds, the charge on capacitor 129 will increase to approximately 1.8 volts, making the voltage at the collector of transistor 124 $-4.2$ volts. Capacitor 129 will again discharge on the next pulse, and will continue to charge and discharge as long as the input signal to the expander circuit is constant in amplitude. Diode 121 remains back biased and transistor 117 remains off, so the gain control action on field effect transistor 107 remains stable.

A loss in the signal level at the input to the expander, or a change in signal level over more than 3 cycles will allow the collector voltage of transistor 124 to increase sufficiently to forward bias diode 121 and transistor 119, causing transistor 119 to go into saturation, which instantly charges capacitor 115 to a $-6$ volts, biasing transistor 107 completely off, allowing the gain of the op amp 81 to be maximum.

Resistors 133 and 135 and transistor 137 complete the expander circuitry. The emitter of transistor 137 is returned to a $-2.5$ volt level through resistor 135. Since the base voltage of transistor 137 is referenced to zero volts DC, the emitter voltage will be approximately 0.7 volts lower, which fixes the emitter current at 0.818 milliamps and the collector voltage at plus 150 volts. This stage has a voltage gain of 81.

FIGS. 2, 3 and 4 show waveforms at particular circuit points for various values of resistance between test leads 31 and 33. FIG. 2, for instance, shows the waveforms for a direct short between the test leads. In such a case, there will be an input signal to the expander circuit, resulting in a 68 volt peak-to-peak signal about a 150 VDC reference signal at the lower vertical deflection plate 71, as shown in FIG. 2a. However, since there is a direct short between the test leads, the input to operational amplifier 43 will be zero, so that the signal applied to the right horizontal deflection plate is the DC reference voltage of 150 volts, as shown in FIG. 2b. Since there is no horizontal signal other than the DC reference voltage, the resulting trace on the screen is a straight vertical line, as shown in FIG. 2c.

For a resistance between the test leads of 100 milliohms, (FIG. 3) there again will be a signal at the input to the expander circuit, so the signal at the lower vertical deflection plate 71 is again 68 volts peak-to-peak about a DC reference signal of 150 volts, as shown in FIG. 3a. Since there is some resistance between the test leads, there will be a current in the secondary 19 and a voltage will be developed on intermediate tap lead 29. For 100 milliohms, the signal applied to the right horizontal deflection plate is 100 volts peak-to-peak, about the DC reference of 150 volts, as shown in FIG. 3b. This results in a straight line trace which slopes downwardly from left to right on the screen, as shown in FIG. 3c. The trace intersects the calibrated 100 millohm point at the top of the screen, as shown.

For an open circuit between the test leads (FIG. 4), there will be no signal input to the expander, and hence, the signal presented to the lower vertical deflection plate 71 is the reference signal of 150 VDC. However, there will be a voltage developed on intermediate tap lead 29, reaching a maximum of 12 volts peak-to-peak. This voltage is sufficient to force transistor 53 into saturation, resulting in the waveform of FIG. 4b at the right horizontal deflection plate, a 300 volt peak-to-peak signal about the 150 VDC reference. This results in a horizontal line on the oscilloscope screen, as shown in FIG. 4c.

Hence, the angle of the trace on the oscilloscope screen will vary from a vertical line, for a direct short, to a horizontal line, for an open circuit, with the angle of the slope of the trace in between those extremes depending upon the amount of resistance between the test leads, as stated above. An increase in the test resistance will cause a counter-clockwise rotation of the trace, while a decrease in the test resistance will cause a clockwise rotation of the trace.

Figure 6:
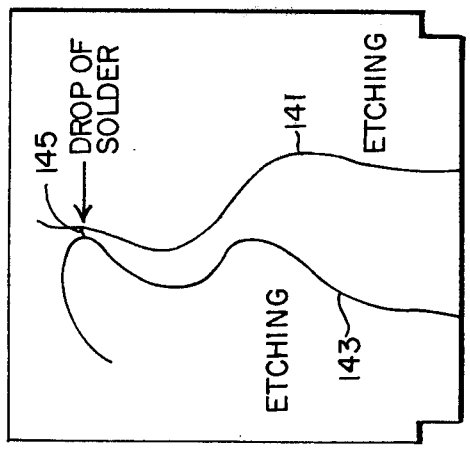
FIG. 6 is a representation of a portion of two etchings on a printed circuit board having a solder bridge between them.

With such an arrangement, the operator may move one test lead along one printed circuit etching, such as etching 141 in FIG. 6, while maintaining the other test lead stationary on an adjacent etching, such as etching 143, watching the rotational movement of the trace. When the trace begins to rotate clockwise, the test leads are approaching a short 145. When the trace is substantially vertical, the test leads should be close to the location of the short. It should be understood, however, in practical use of the apparatus, that a direct short will rarely be encountered, due to the resistance of the etchings themselves and the wire lengths necessary to complete the circuit between the test leads. Thus, the use of the term electrical short herein does not necessarily mean zero resistance but instead refers to values of resistance that would normally be encountered in the etching or wire lengths necessary to bridge the gaps in the shorted etchings or elements. For instance, the undesirable solder bridge in FIG. 6 can be located by moving one of the test leads along an etching until the trace indicates approximately 50 milliohms of resistance. This procedure can in fact be accomplished rapidly and accurately.

Hence, an apparatus has been shown and described which is capable of accurately and rapidly determining the location of electrical shorts between etchings in printed circuits and also in elements in other circuits, using only two test leads. The apparatus is further advantageous in that the information regarding the location of the short is displayed visually and can be easily interpreted, even by an unsophisticated operator who is not knowledgeable about the operation of the apparatus itself.

Although a preferred embodiment of the invention has been disclosed herein for purposes of illustration, it should be understood that various changes, modifications and substitutions may be incorporated in such embodiment without departing from the spirit of the invention as defined by the claims which follow.

What is claimed is:

1. An apparatus for detecting electrical shorts which is particularly useful with printed circuits, comprising:
   impedance means having first and second leads extending therefrom;
   first and second test lead means, one test lead means being connected to the first lead from said impedance means, the other test lead means being connected to ground;
   resistance means connected between the second lead from said impedance means and ground;
   means for inducing an AC signal into said impedance means, so that an AC signal is produced on the first lead, resulting in a current flow in the circuit comprising said first impedance means, said first and second test lead means, said resistance means and ground, when there is not an open circuit between said first and second test lead means;
   a visual indicator means having vertical and horizontal deflection plates, such as an oscilloscope;
   first amplifier means, including means connected to said impedance means for applying substantially the value of voltage on said first lead to the input of said first amplifier means, and means for applying the output of said first amplifier means to one horizontal deflection plate of said visual indicator means; and
   second amplifier means, including means connected to the second lead of said impedance means for applying the voltage on the second lead to the input of said second amplifier means, and means for applying the output of said second amplifier means to one of the vertical deflection plates of said visual indicator means, said second amplifier means including means for maintaining the peak voltage of the signal applied to the vertical deflection plates at a predetermined level, regardless of the peak of the signal applied to the input of said second amplifier means.

2. An apparatus in accordance of claim 1, including means for insuring that the voltage at the input of said first amplifier means is substantially zero when there is a direct short between said first and second test lead means.

3. An apparatus of claim 2, wherein said means for insuring includes third and fourth leads extending from said impedance means on opposite sides of said first lead, and a variable resistance means connecting said third and fourth means, the variable resistance means including an adjustable center arm which is connected to the input of said first amplifier means.

4. An apparatus of claim 3, wherein said first lead is intermediate of said third and fourth leads.

5. An apparatus of claim 1, wherein the value of said resistance means is relatively low.

6. An apparatus of claim 1, wherein said first and second amplifier means each include means for establishing a DC reference voltage for their respective output signals.

7. An apparatus of claim 1, wherein said first amplifier means includes a series combination of an operational amplifier and a transistor amplifier, the gain of said operational amplifier, and hence said first amplifier means, being adjustable.

8. An apparatus for detecting electrical shorts which is particularly useful with printed circuits, comprising:
   a source of AC voltage;
   transformer means comprising a primary winding and a secondary winding, the secondary winding having first, second, third, and fourth leads extending therefrom in sequence, the first lead being connected through a variable resistance means to the third lead;
   resistance means connected between the fourth lead and ground;
   first and second test lead means, one test lead means being connected to the second lead, the other test lead means being connected to ground;
   first amplifier means connected to said variable resistance between the first lead and the third lead;
   means for connecting the output of said first amplifier means to one of the horizontal deflection plates of a visual indicator means, such as an oscilloscope:
   second amplifier means connected to the fourth lead, said second amplifier means including means for establishing the gain of said second amplifier means, for each test event, so that the peak output of said second amplifier means is at a predetermined level which results in substantially full vertical deflection of the trace on the visual indicator means, regardless of the peak voltage level of the input signal to said second amplifier means; and
   means connecting the output of said second amplifier means to one of the vertical deflection plates of the visual indicator means.

9. An apparatus of claim 8, wherein the secondary winding of said transformer means has substantially the same number of turns between the second and fourth leads as the primary winding of said transformer means.

10. An apparatus of claim 8, wherein the AC signal provided by said source of AC voltage has a frequency of approximately 60 Hz, and said primary winding includes a resistor for limiting the maximum flux in said transformer to a level which is substantially less than the saturation level of said transformer means.

11. An apparatus of claim 9, wherein said first and second amplifier means each include means for establishing a DC reference voltage for their respective output signals.

* * * * *